United States Patent
Huynh

(10) Patent No.: US 10,126,872 B2
(45) Date of Patent: Nov. 13, 2018

(54) TOUCH COMMAND DEVICE

(71) Applicant: Valeo Systemes Thermiques, Le Mesnil Saint Denis (FR)

(72) Inventor: Tan Duc Huynh, Neuilly sur Marne (FR)

(73) Assignee: Valeo Systemes Thermiques, Le Mesnil Saint Denis (FR)

( * ) Notice: Subject to any disclaimer, the term of this patent is extended or adjusted under 35 U.S.C. 154(b) by 14 days.

(21) Appl. No.: 15/102,891

(22) PCT Filed: Dec. 10, 2014

(86) PCT No.: PCT/FR2014/000270
§ 371 (c)(1),
(2) Date: Jun. 9, 2016

(87) PCT Pub. No.: WO2015/086920
PCT Pub. Date: Jun. 18, 2015

(65) Prior Publication Data
US 2016/0357341 A1 Dec. 8, 2016

(30) Foreign Application Priority Data

Dec. 11, 2013 (FR) ...................... 13 02905

(51) Int. Cl.
*G06F 3/045* (2006.01)
*G06F 3/041* (2006.01)
(Continued)

(52) U.S. Cl.
CPC ............ *G06F 3/0418* (2013.01); *B60K 37/06* (2013.01); *G06F 3/044* (2013.01); *G06F 3/045* (2013.01);
(Continued)

(58) Field of Classification Search
CPC ... G06F 3/04883; G06F 3/0482; G06F 3/0488
See application file for complete search history.

(56) References Cited

U.S. PATENT DOCUMENTS

| 8,400,409 B1 | 3/2013 | Francis |
| 2009/0101417 A1* | 4/2009 | Suzuki .................. G06F 3/0418 178/18.06 |

(Continued)

FOREIGN PATENT DOCUMENTS

| EP | 2372914 A1 | 10/2011 |
| WO | 2013/172820 A1 | 11/2013 |

OTHER PUBLICATIONS

International Search Report issued in PCT/FR2014/000270 dated Mar. 5, 2015 (2 pages).

(Continued)

Primary Examiner — Nan-Ying Yang
(74) Attorney, Agent, or Firm — Osha Liang LLP

(57) ABSTRACT

A command device (6) for at least one function of a motor vehicle, the device comprising: —a touchpad (1) configured to receive a command of said at least one function, —at least one antenna (3,4) arranged around the touchpad (1) in such a way as to frame said touchpad (1), the antenna (3,4) being capable of forming a capacitor with at least one exterior element (2,5) in contact with the touchpad (1), —means for measuring (8) the capacitance of the capacitor formed by the antenna (3,4) and said at least one exterior element (2,5), and —a means of control of the command (9) configured so as to take account of the command received by the touchpad (1) when the capacitance measured by the measurement means (8) lies in a predetermined interval.

11 Claims, 2 Drawing Sheets

(51) Int. Cl.
　　　H03K 17/96　　　(2006.01)
　　　G06F 3/044　　　(2006.01)
　　　B60K 37/06　　　(2006.01)
(52) U.S. Cl.
　　　CPC .. *H03K 17/9622* (2013.01); *B60K 2350/1024* (2013.01); *B60K 2350/1028* (2013.01); *H03K 2217/960705* (2013.01)

(56) References Cited

U.S. PATENT DOCUMENTS

| | | | |
|---|---|---|---|
| 2011/0061948 A1* | 3/2011 | Krah | G06F 3/0418 178/18.01 |
| 2014/0095031 A1* | 4/2014 | Boblett | B60G 17/015 701/49 |
| 2015/0028897 A1* | 1/2015 | Koo | G01R 27/2605 324/690 |
| 2015/0144475 A1* | 5/2015 | Johnson | H03K 17/9622 200/600 |

OTHER PUBLICATIONS

Written Opinion of the International Searching Authority issued in PCT/FR2014/000270 dated Mar. 5, 2015 (5 pages).

\* cited by examiner

TOUCH COMMAND DEVICE

TECHNICAL FIELD OF THE INVENTION

The present invention relates to the field of touch control devices for at least one function of a motor vehicle. The invention relates also to the methods for manufacturing such control devices and the associated control methods.

In particular, the invention relates to the devices for controlling the opening and/or closing, for example, of roofs and/or windows, such as the opening and/or the closing of motor vehicle roofs and/or windows.

PRIOR ART

In the technical field of control devices, it is known practice to use control devices comprising systems with a mechanical button to be actuated by a user.

It is also proposed to provide touch control devices using touch systems, such as, for example, touchpads.

These touch control devices are generally configured to be activated by means of a finger or by using a stylus.

The touch control devices are generally more sensitive than the mechanical systems. Thus, the touch control devices are more sensitive to unwanted activations. Typically, a user can activate a command by contact with the elbow or even with a bag on the touchpad of the control device.

There is therefore a need to secure such touch control devices, in particular to avoid unwanted commands being taken into account.

SUMMARY OF THE INVENTION

The aim of the invention is notably to propose a secured control device and method, in particular making it possible to not take account of unwanted commands.

For this, the invention relates to a control device for at least one function of a motor vehicle, the device comprising:
- a touchpad configured to receive a command for said at least one function,
- at least one antenna arranged around the touchpad so as to frame said touchpad, the antenna being able to form a capacitor with at least one external element coming into contact with the touchpad,
- a means for measuring the capacitance of the capacitor formed by the antenna and said at least one external element, and
- a means for monitoring the control configured to take account of the command received by the touchpad when the capacitance measured by the measurement means lies within a predetermined range.

Thus, the invention makes it possible to not take account of unwanted commands, when they are performed by an element other than the hand such as an elbow or a bag, actuating the touchpad.

In understanding the invention, the term "frame" should be understood to mean the fact of forming an outer frame, not necessarily closed, but arranged on at least two sides of the framed element and substantially in the same plane thereof. The term "surround" should be understood to mean the fact of extending over substantially all the sides of the surrounded element and substantially in the same plane thereof.

The control device according to the invention can also comprise one or more of the features below, considered individually or in all technically possible combinations:

the touchpad is of resistive type; and/or
the touchpad is of capacitive type; and/or
the antenna is substantially planar and substantially coplanar to the touch surface of the touchpad; and/or
the antenna comprises a plurality of sub-antennas arranged on either side of the touchpad; and/or
said at least one antenna surrounds the touchpad; and/or
the antenna surrounding the touchpad is of a single piece; and/or
the device is suitable for controlling a window and/or sunroof.

The invention relates also to a method for controlling at least one function of a motor vehicle by means of a touchpad and at least one antenna arranged around the touchpad so as to frame said touchpad, the method comprising steps for:
forming a capacitor by means of the antenna and at least one external element coming into contact with the touchpad,
measuring the capacitance of the capacitor formed by the antenna and said at least one external element, and
monitoring the control by taking account of the command received by the touchpad when the measured capacitance lies within a predetermined range.

DESCRIPTION OF THE FIGURES

The invention will be better understood on reading the following description, given as a nonlimiting example of implementation thereof, and on studying the attached drawings in which.

DETAILED DESCRIPTION OF THE INVENTION

Figure 1:
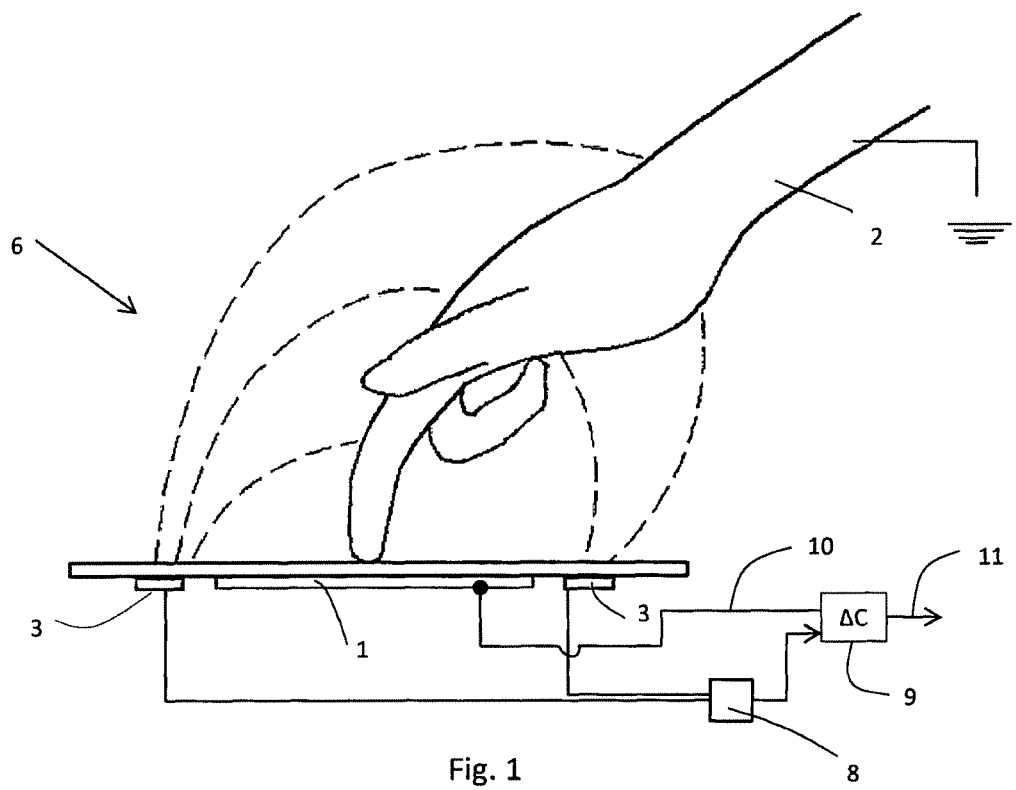
FIG. 1 illustrates a control device according to the invention controlled by a hand of a user, in side view.
Figure 2:
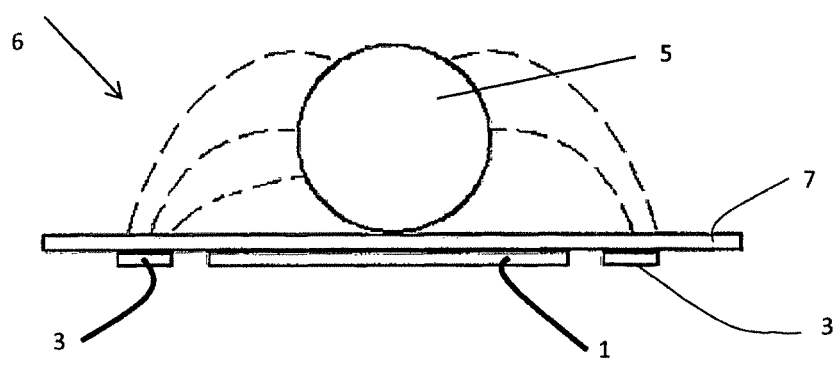
FIG. 2 illustrates a control device according to FIG. 1 during a test assessing the securing of the control device according to the invention.

Referring to FIGS. 1 and 2, the control device 6 according to the invention allows a user to control at least one function of a motor vehicle, in particular the opening or closing of the roof, windows, or a partition.

The control device represented in FIG. 1 comprises a touchpad 1. The touchpad 1 is often used instead of or in combination with mechanical controls for controlling a function in a motor vehicle.

The touchpad 1 of the control device according to the invention is connected to electromechanical systems actuating the functions of the motor vehicle to be controlled. Thus, the control device 6 is able to control at least one function by a contact on the touch surface of the touchpad 1. This control is performed via a means external to the control device 6 such as one or more fingers of the hand 2 of a user.

The touchpad 1 is connected to the electromechanical systems for example by a connection 10 configured to transmit a command signal. The command signal thus transmitted will then be interpreted, for example by an onboard computer, in order to execute the function commanded on the touchpad 1, such as a command to close or open a window, partition or roof of the motor vehicle.

The control device according to the invention further comprises at least one antenna 3 arranged around the touchpad 1 so as to frame the touchpad 1. The antenna 3 is preferably substantially planar and/or substantially coplanar to the touch surface of the touchpad 1. These two aspects offer, independently of one another, advantages in the mounting of the control device. In effect, since the touchpad 1 is substantially planar, the mounting thereof on parts of the control device such as a protection plate 7 is simplified and allows for a space saving to mount other planar parts. FIG. 1 illustrates one embodiment of the invention whereby the antenna 3 surrounds the touchpad 1.

Advantageously, the antenna 3 makes it possible to detect the type of external element coming into contact with the touchpad, and thus monitor the control as a function of a given external element.

As represented in FIG. 1, the antenna 3 forms a capacitor with the external element 3, for example the hand of the user, coming into contact with the touchpad. In effect, the antenna 3 is configured so that, when a voltage is applied thereto, it forms an electrical field as illustrated in FIGS. 1 and 2. Thus, when an external element, here the hand 2 of the user, comes into contact with the touch surface, the external element and the antenna 3 together form a capacitor of given capacitance.

The capacitance of the duly formed capacitor depending on the nature, in particular of the material and of the volume of the external element. Thus, it is possible to distinguish the external elements in contact with the touchpad. In particular, by measuring the capacitance of the duly formed capacitor, it is possible to distinguish a hand from an elbow or even from a bag.

The control device 6 further comprises a measurement means 8. The measurement means 8 is configured to measure the capacitance of the capacitor formed by the external element 2 and the antenna 3. The measurement means 8 is connected to the antenna 3 as can be seen in FIG. 1. Obviously, the mounting and the invention can be adapted to detect an electrical load instead of a capacitance, without departing from the scope of the invention. Thus, a capacitance meter or a coulombmeter or any means for measuring the capacitance known to those skilled in the art can be used.

The control device 6 further comprises a means for monitoring the control 9. The control monitoring means 9 is connected to the measurement means 8. Thus, it is able to receive a signal relating to the measurement of the capacitance from the measurement means 8. Moreover, the control monitoring means 9 is able to receive a command signal from the touchpad 1 via the connection 10. Thus, the control monitoring means 9 is inserted between the touchpad 1 and the electromechanical systems actuating the functions of the motor vehicle to be controlled.

At the output of the control monitoring means 9, a connection 11 is provided to link it to said electromechanical systems. The control monitoring means 9 and the connections 10 and 11 are configured so that the command signal received by the connection 10 can be modified, according to certain determined parameters, at the control monitoring means 9. The duly modified command signal is transmitted by the connection 11.

In particular, the control monitoring means 9 is configured as a filter allowing the command signal to pass as a function of predetermined parameters.

The predetermined criteria are by a range of capacitance value measured on the measurement means 8. Thus, the control monitoring means 9 behaves as a bandpass filter, allowing the command signal received from the touchpad 1 to pass only when the capacitance measured by the measurement means 8 lies within a predetermined range.

The predetermined capacitance range depends on the antenna 3 used, for example on the type of antenna, on its form, its arrangement. The capacitance value range corresponding to a hand of a user is therefore a function of the specifics of each device.

In use, when the user performs a command on the touch surface of the touchpad, he or she places his or her hand 2, in particular a finger, on the touch surface. At that moment, the antenna 3 and the external element, here the hand 2 of the user, form a capacitor of given capacitance. The capacitance is measured by the measurement means 8 and a signal relating to this capacitance is transmitted to the control monitoring means 9.

In parallel, at the moment when the user performs the command on the touchpad, a command signal is emitted thereby, via the connection 10, to the control monitoring means 9.

The control monitoring means 9 receives the command signal from the touchpad, as well as the signal relating to the capacitance measured by the measurement means 8. Based on these signals, the control monitoring means 9 transmits or does not transmit the command signal. For example, the control monitoring means 9 will:
  if the capacitance measured by the measurement means 8 is within a predetermined range, transmit the command signals to the electromechanical systems actuating the functions to be controlled; and
  if the capacitance measured by the measurement means 8 is not within the predetermined range, not transmit the command signal from the touchpad to the electromechanical systems, thus avoiding having an unwanted command taken into account.

In this way, the control device 6 makes it possible to not take account of the unwanted commands, for example deriving from contact by a bag or an elbow with the touchpad. In effect, by virtue of this characteristic capacitance, it is possible to identify the external element coming into contact with the touchpad 1. Thus, it is easier to monitor the commands performed on the touchpad, and take account only of the commands performed by means of a predetermined external element.

Some standards, notably in the United States, provide for the touch control devices, notably for motor vehicles, not to be activated in error. For example, the United States standard FMVSS 118 (Federal Motor Vehicle Safety Standard) relative to the securing of this type of touch control device provides for a so-called sphere test to be performed. In this test, a sphere 5 is applied against a window, partition or roof control touchpad with a force not exceeding 135 Newtons (30 pounds). In this test, the closing of the window, the partition or the roof must not be activated. This test is illustrated in FIG. 2.

The sphere 5 is made of stainless steel, with a radius of 20 mm+/−0.2 mm and has a surface finish of between 8 and 4 micro inches.

The sphere 5 of this test models the unwanted commands on the touchpad 1.

When performing the sphere test on a control device 6 according to the invention, the sphere 5 of steel is applied against the touchpad 1 for a function command, such as a window, partition or roof command. At the moment of contact between the sphere 5 made of steel and the touchpad 1, the sphere 5 and the antenna 3 together form a capacitor of given capacitance different from that of the antenna 3 with the hand of the user. This capacitance is measured by the measurement means 8 and is transmitted to the control monitoring means 9, similarly, the signal for the command performed by the sphere 5 is transmitted by the touchpad 1 to the control monitoring means 9. Based on the measured capacitance, the control monitoring means 9 transmits or does not transmit the command signal and the corresponding function is or is not performed.

Preferably, the command signal is transmitted only if the measured capacitance lies within a predetermined range. Thus, with a calibration or a sufficiently accurate determination of the capacitance range corresponding to the appropriate external element, the control device according to the invention makes it possible to run the sphere test in accordance with the FMVSS 118 standard.

Figure 3:
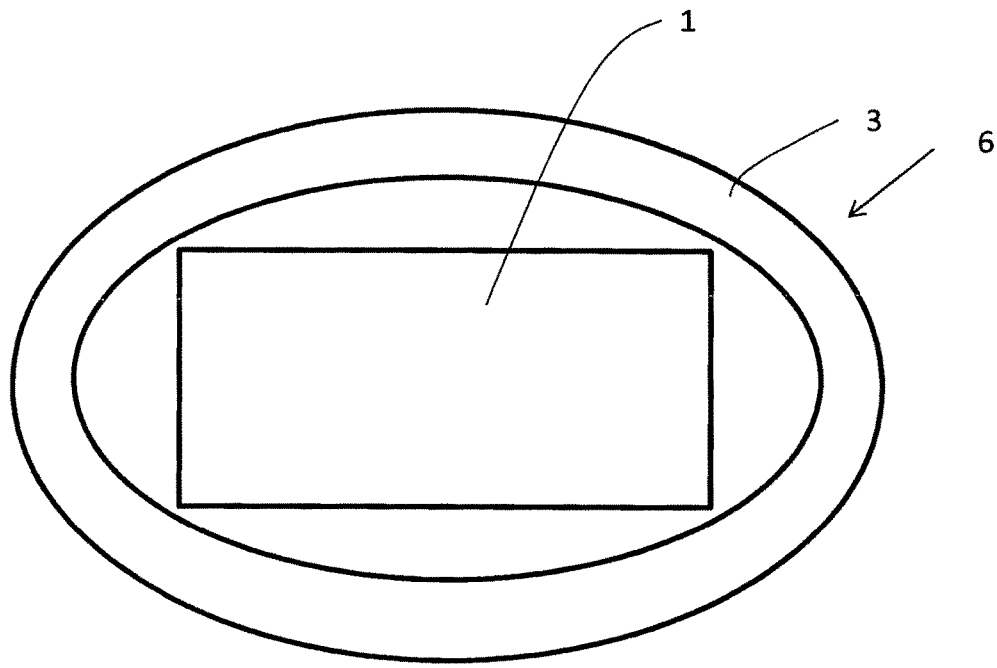
FIG. 3 illustrates a control device according to a variant of the invention in which the antenna surrounds the touchpad.

Referring to FIG. 3, the control device according to a variant of the invention comprises a substantially circular antenna 3 surrounding the touchpad 1. This variant makes it possible to generate a uniform electrical field entirely surrounding the touchpad 1. This aspect makes it possible to further secure the control device 6 by providing a continuous detection zone surrounding the touchpad both on the sides and at the corners. Furthermore, the determination of the capacitances is simplified, because of a simplified electronic setup because it is connected to a single antenna 3.

Figure 4:
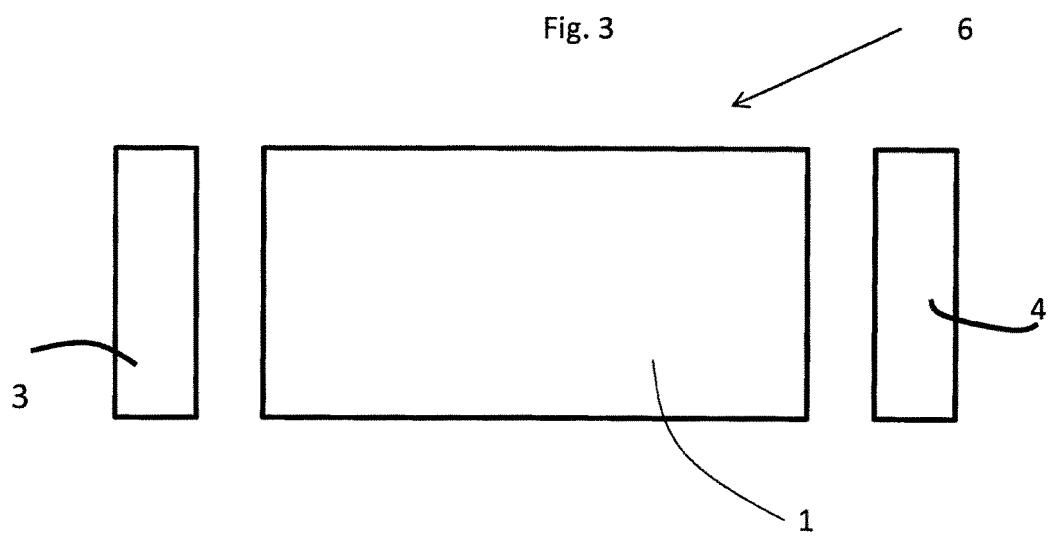
FIG. 4 illustrates a control device according to a variant of the invention in which the antenna comprises two sub-antennas arranged on either side of the touchpad.

Referring to FIG. 4, the control device according to another variant of the invention comprises an antenna which itself comprises two sub-antennas 3 and 4 arranged on either side of the touchpad 1. These sub-antennas 3, 4 are preferably planar and/or rectangular. Thus, they allow for simplified mounting by being fitted onto the planar parts of the control device 6.

Obviously, the invention is not limited to the embodiments described and extends to other variants within the scope of the claims.

Herein, the word "comprising" does not preclude other elements, and the indefinite article "a" or "an" does not preclude a plurality. The simple fact that the different features are cited together in different dependent claims does not indicate that the combination of these features cannot be used advantageously. Any reference symbol in the claims should not be interpreted as limiting the scope of the invention.

The invention claimed is:

1. A control device for at least one function of a motor vehicle, the device comprising:
   a touchpad that receives a command for said at least one function;
   at least one antenna arranged around the touchpad so as to frame said touchpad, the at least one antenna forms a capacitor with at least one external element coming into contact with the touchpad;
   a capacitance meter that measures a capacitance of the capacitor formed by the at least one antenna and said at least one external element based on:
      a material of the at least one external element, and
      a volume of the at least one external element;
   an electronic filter that gates the command received by the touchpad by:
      allowing passage of an entirety of the command received by the touchpad when the capacitance measured by the capacitance meter lies within a predetermined range; and
      blocking passage of the command received by the touchpad when the capacity measured by the capacitance meter lies outside the predetermined range, and
   wherein the touchpad is coupled with the electronic filter to be used instead of or in combination with mechanical controls for controlling a function in the motor vehicle.

2. The control device as claimed in claim 1, in which the touchpad is of resistive type.

3. The control device as claimed in claim 1, in which the touchpad is of capacitive type.

4. The control device as claimed in claim 1, in which the at least one antenna is substantially planar and substantially coplanar to the touch surface of the touchpad.

5. The control device as claimed in claim 1, in which the at least one antenna comprises a plurality of sub-antennas arranged on either side of the touchpad.

6. The control device as claimed in claim 1, in which said at least one antenna surrounds the touchpad.

7. The control device as claimed in claim 6, in which the at least one antenna surrounding the touchpad is of a single piece.

8. The control device as claimed in claim 1, for controlling a window and/or sunroof.

9. A method for controlling at least one function of a motor vehicle by means of a touchpad and at least one antenna arranged around the touchpad so as to frame said touchpad, the method comprising:
   receiving a command for said at least one function, by the touchpad;
   forming a capacitor using the at least one antenna and at least one external element coming into contact with the touchpad;
   measuring a capacitance of the capacitor formed by the at least one antenna and said at least one external element based on:
      a material of the at least one external element, and
      a volume of the at least one external element; and
   electronically filtering the command received by the touchpad by:
      allowing passage of an entirety the command received by the touchpad when the measured capacitance lies within a predetermined range; and
      blocking passage of the command received by the touchpad when the measured capacity lies outside the predetermined range, and
   wherein the touchpad is coupled with the electronic filter to be used instead of or in combination with mechanical controls for controlling a function in the motor vehicle.

10. The control device of claim 1, wherein the control device determines a type of the at least one external element coming into contact with the touchpad based on the capacitance measured when the at least one external element contacts the touchpad.

11. The control device of claim 1, further comprising:
   a controller coupled to the electronic filter that monitors the command received by the touchpad,
   wherein the controller supplies the filter with the predetermined range based on a type of the at least one external element identified.

* * * * *